US008362818B2

(12) United States Patent
Suzuki

(10) Patent No.: US 8,362,818 B2
(45) Date of Patent: Jan. 29, 2013

(54) CLOCK ADJUSTMENT CIRCUIT, SHIFT DETECTION CIRCUIT OF DUTY RATIO, IMAGING DEVICE AND CLOCK ADJUSTMENT METHOD

(75) Inventor: Misao Suzuki, Kanagawa (JP)

(73) Assignee: Sony Corporation, Tokyo (JP)

( * ) Notice: Subject to any disclaimer, the term of this patent is extended or adjusted under 35 U.S.C. 154(b) by 66 days.

(21) Appl. No.: 13/090,467

(22) Filed: Apr. 20, 2011

(65) Prior Publication Data

US 2011/0285441 A1 Nov. 24, 2011

(30) Foreign Application Priority Data

May 24, 2010 (JP) ................................. 2010-118810

(51) Int. Cl.
*H03K 3/017* (2006.01)

(52) U.S. Cl. ....................................... 327/175; 327/172

(58) Field of Classification Search ........... 327/172–176
See application file for complete search history.

(56) References Cited

U.S. PATENT DOCUMENTS

| 7,015,739 | B2 * | 3/2006 | Lee et al. | 327/175 |
| 7,199,634 | B2 * | 4/2007 | Cho et al. | 327/175 |
| 7,417,479 | B2 * | 8/2008 | Kitayama | 327/175 |
| 8,106,695 | B2 * | 1/2012 | Miyano | 327/175 |

FOREIGN PATENT DOCUMENTS

JP 2005-323331 11/2005

* cited by examiner

*Primary Examiner* — An Luu
(74) *Attorney, Agent, or Firm* — SNR Denton US LLP

(57) ABSTRACT

A clock adjustment circuit includes: first and third switching elements to be in a conductive state when in-phase and reverse-phase clock signals in a high level are applied to input terminals, respectively; second and fourth switching elements whose input terminals are connected to output terminals of the first and third switching elements, respectively, which become in the conductive state when the in-phase and reverse-phase clock signals in a low level are applied to output terminal, respectively; first and second capacitor elements whose one terminal is connected to an output terminal of the first and third switching element, respectively; and a shift detection unit detecting potential difference between the output terminals of the first and third switching elements and outputs the detection signal as a signal for adjusting a duty ratio of the clock signal.

11 Claims, 10 Drawing Sheets

CONFIGURATION EXAMPLE OF CLOCK ADJUSTMENT CIRCUIT

CONFIGURATION EXAMPLE OF DUTY RATIO CHANGING CIRCUIT

CIRCUIT CONFIGURATION EXAMPLE OF DELAY ELEMENT

OPERATION WAVEFORM EXAMPLE OF DELAY ELEMENT

CONFIGURATION EXAMPLE OF LOGIC CIRCUIT OF FIRST DELAY ELEMENT

CONFIGURATION EXAMPLE OF LOGIC CIRCUIT OF SECOND DELAY ELEMENT

CONFIGURATION EXAMPLE OF DUTY RATIO DETECTION CIRCUIT

H-PERIOD

L-PERIOD

FLOWCHART OF DUTY RATIO ADJUSTMENT METHOD

TIMING CHART OF DUTY RATIO ADJUSTMENT

CONFIGURATION OF DUTY RATIO DETECTION CIRCUIT IN MODIFICATION EXAMPLE 1

CONFIGURATION OF DUTY RATIO DETECTION
CIRCUIT IN MODIFICATION EXAMPLE 2-1

CONFIGURATION OF DUTY RATIO DETECTION
CIRCUIT IN MODIFICATION EXAMPLE 2-2

CIRCUIT BLOCK DIAGRAM ON THE PERIPHERY OF
COUNTER IN RELATED-ART SOLID-STATE IMAGING DEVICE

OPERATION SUMMARY OF DDR-DRIVEN COUNTER IN RELATED ART

CLOCK ADJUSTMENT CIRCUIT, SHIFT DETECTION CIRCUIT OF DUTY RATIO, IMAGING DEVICE AND CLOCK ADJUSTMENT METHOD

BACKGROUND OF THE INVENTION

1. Field of the Invention

The present invention relates to a clock adjust circuit, a shift detection circuit, an imaging device and a clock adjustment method capable of detecting and adjusting a shift in a duty ratio of a clock signal.

2. Description of the Related Art

Clock signals are heretofore used for controlling operations in various electronic apparatuses. For example, clock signals are supplied also to circuits such as a counter and a DAC (Digital to Analog Converter) in solid-state imaging devices such as a CIS (Contact Image Sensor) (for example, refer to JP-A-2005-323331 (Patent Document 1)).

Here, FIG. 15 shows a circuit block configuration on the periphery of the counter used in the related-art solid-state imaging device, for example, proposed in Patent Document 1. In the related-art solid-state imaging device, a clock signal (internal clock) having a given duty ratio generated by a clock generation unit 201 is supplied to a DAC 203 and a counter 204 through a buffer 202. In such solid-state imaging device, the counter 204 is driven by a DDR (Double Data Rate) system to generate a high-definition as well as high-frame rate video signal.

The operation outline performed when the counter 204 is driven by the DDR system will be explained reference to FIG. 16. FIG. 16 is a schematic block configuration diagram of the DDR-driven counter 204. The DDR-driven counter 204 includes a first latch 205 and a second latch 206. The clock signal (CLK in FIG. 16) is inputted to one input terminal of the first latch 205 and a data signal (Data in FIG. 16) is inputted to the other input terminal. Additionally, the clock signal is inputted to one input terminal of the second latch 206 through a NOT element 207 (inverter) and the data signal is inputted to the other input terminal.

When the counter 204 is DDR-driven, counting processing is performed at both timings of rising and falling of the clock signal to be inputted. Specifically, the first latch 205 latches data when triggered by rising of the clock signal, and the second latch 206 latches data when triggered by falling of the clock signal. Then, the data latched by the second latch 206 is used as the least significant bit of the counter 204.

In the counter 204 having the above configuration, a trigger cycle in which data is latched by the first latch 205 and the second latch 206 is desired to be half of the cycle of the clock signal. That is, the duty ratio of the clock signal at the time of driving the counter 204 in the DDR system is ideally desired to be 50%.

In the present specification, "duty ratio" of the clock signal means the ratio of a high-level period occupied in one cycle of the clock signal, which can be calculated by [H-width/clock signal cycle]×100%. Hereinafter, the high-level period and a low-level period of the clock signal are referred to as an H-period and an L-period and values of the time width of the H-period and the L-period are referred to as an H-width and an L-width.

SUMMARY OF THE INVENTION

As described above, for example, when the counter and so on of the solid-state imaging device are driven by using the DDR system, it is desirable that the duty ratio of the clock signal to be supplied is 50%. However, there is a problem that the duty ratio of the clock signal varies according to, for example, conditions of manufacturing processes of driving power supply of a circuit generating the clock signal (hereinafter referred to as merely a clock generation circuit) or the clock generation circuit. Specifically, in a configuration of the related-art clock generation circuit, the duty ratio of the clock signal varies due to variations in manufacture of transistors included in the circuit or variations of operation voltage and so on.

In this case, there occur problems such that a setup hold time tSH of the counter is pressed and that an operation margin of the counter is reduced. More specifically, variation (shift from a desired value) of the duty ratio of the clock signal affects the least significant bit of the counter driven by the DDR system. For example, when the duty ratio becomes 60% due to variations in manufacture of the clock generation circuit in the counter operating in a 200 MHz DDR system, the H-width of the clock signal is 6 nS and the L-width is 4 nS. In such case, it is necessary to secure the counter operation in L-width=4 nS. That is, when the duty ratio is shifted, a lower limit value of an operation frequency or a value of the lower limit operation voltage of the counter are likely to be rate-limited.

The clock generation circuit is heretofore manufactured as part of a logic circuit in many cases including Patent Document 1, and analog design taking duty ratio into account is not performed in such cases. Accordingly, there are not so many clock generation circuits having robust property with respect to the operation voltage and manufacturing processes.

As a method of suppressing effects of a shift in the duty ratio of the clock signal, a method of using a double-speed clock signal is used in related art. However, requests to higher definition and higher frame rate are increased, for example, in the solid-state imaging device in recent years, and it is necessary to shift a frequency of the clock signal which drives the counter and the DAC to be higher in order to respond to these requests. It is difficult to address the problems by using the double-speed clock signal under the present circumstances.

Thus, it is desirable to provide a clock adjustment circuit, a shift detection circuit, an imaging device and a clock adjustment method capable of correcting a shift in a duty ratio of a clock signal without using a double-speed clock signal even when an operation frequency of the clock signal is increased.

According to an embodiment of the invention, there is provided a clock adjustment circuit having a configuration of including a first switching element, a second switching element, a third switching element, a fourth switching element, a first capacitor element, a second capacitor element and a shift detection circuit. Configurations and operations of respective units are as follows. The first switching element becomes in a conductive state when an in-phase clock signal in a high level is applied to an input terminal. An input terminal of the second switching element is connected to an output terminal of the first switching element, which becomes in the conductive state when the in-phase clock signal in a low level is applied to an output terminal. The third switching element becomes in the conductive state when a reverse-phase clock signal in a high level is applied to an input terminal. An input terminal of the fourth switching element is connected to an output terminal of the third switching element, which becomes in the conductive state when the reverse-phase clock signal in a low level is applied to an output terminal. One terminal of the first capacitor element is connected to an output terminal of the first switching element. One terminal of the second capacitor element is connected to an output terminal of the third switching element. The shift detection unit detects potential difference between the output terminal of the first switching element and the output terminal of the third switching element and outputs the detection signal as a signal for adjusting a duty ratio of the clock signal.

According to another embodiment of the invention, there is provided a shift detection circuit of a duty ratio of including a first switching element, a second switching element, a third switching element, a fourth switching element, a first capacitor element, a second capacitor element and a shift detection unit in the same manner as the clock adjustment circuit according to the embodiment of the invention.

According to still another embodiment of the invention, there is provided an imaging device including the clock adjustment circuit according to the embodiment of the invention.

According to yet another embodiment of the invention, there is provided a clock adjustment method of the duty ratio of the clock signal by the clock adjustment circuit according to the embodiment of the invention, which is performed as follows. First, the in-phase clock signal from the outside is applied to the input terminal of the first switching element and the output terminal of the second switching element as well as the reverse-phase clock signal is applied to the input terminal of the third switching element and the output terminal of the fourth switching element. Subsequently, the first capacitor element and the second capacitor element repeat charging and discharging due to the application of the clock signal. After repeating charging and discharging of the first capacitor element and the second capacitor element for a given period of time, the shift detection unit detects potential difference between the output terminal of the first switching element and the output terminal of the third switching element and outputting the detection signal as a signal for adjusting the duty ratio of the clock signal.

In the embodiment of the invention, the in-phase clock signal is applied to the first and the second switching elements and ON/OFF control is performed to the elements to thereby repeat charging and discharging of the first capacitor element. At the same time, the reverse-phase clock signal is applied to the third and the fourth switching elements and ON/OFF control is performed to the elements to repeat charging and discharging of the second capacitor element. Then, potential difference between the output terminal of the first switching element and the output terminal of the third switching element generated by the operation is detected in the embodiment of the invention and the detection signal is outputted as the signal for adjusting the duty ratio of the clock signal.

As described above, a shift from a desired value of the duty ratio of the clock signal is automatically detected in almost real time regardless of an operation frequency of the clock signal, and the detection signal can be outputted as the signal for adjusting the duty ratio of the clock signal. Therefore, it is possible to correct the duty ratio to a desired value based on the detected shift of the duty ratio without using a double-speed clock signal when the operation frequency of the clock signal is increased according to the embodiment of the invention.

DESCRIPTION OF THE PREFERRED EMBODIMENT

Hereinafter, a clock adjustment circuit, a shift detection circuit and a clock adjustment method according to an embodiment of the invention will be explained in the following order with reference to the drawings. The invention is not limited to the following examples.

Figure 1:
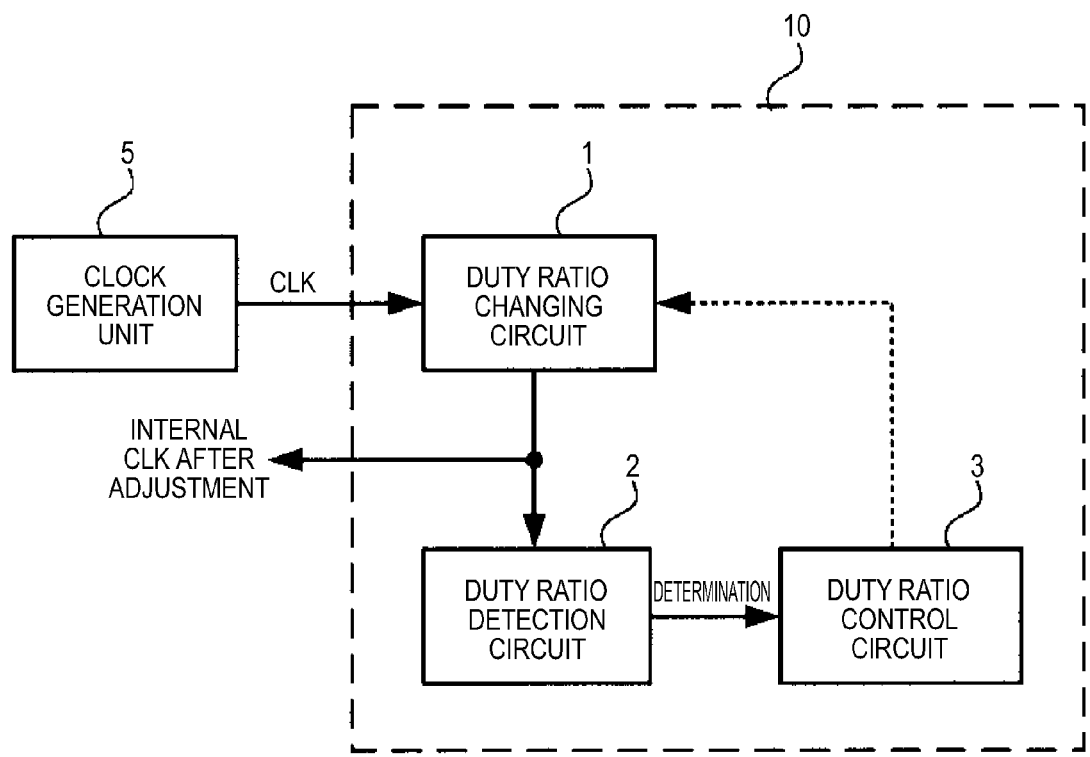
FIG. 1 is a schematic block configuration of a clock adjustment circuit according to an embodiment of the invention.

1. A basic configuration example of a clock adjustment circuit
2. A configuration and operation of a duty ratio changing circuit
3. A configuration and operation of a duty ratio detection circuit
4. A duty ratio adjustment method of a clock signal
5. Various modification examples 1. A Basic Configuration Example of a Clock Adjustment Circuit FIG. 1 shows a block configuration of a clock adjustment circuit according to an embodiment of the invention. A clock adjustment circuit 10 shown in FIG. 1 can be used as a duty ratio adjustment circuit of a clock signal to be supplied to the counter 204, the DAC 203 and so on of a solid-state imaging device (solid-state imaging device) shown in, for example, FIG. 15 and FIG. 16. The invention is not limited to the example and the clock adjustment circuit according to the embodiment can be applied to various electronic apparatuses performing operation control using the clock signal.

The clock adjustment circuit 10 is provided at the termination on an output side of a clock signal generation circuit, and an input terminal thereof is connected to an output terminal of a clock generation unit 5 including a PLL (Phase Locked Loop) and the like. The clock adjustment circuit 10 adjusts a duty ratio of an internal clock signal inputted from the clock generation unit 5 so that an operation margin of an external circuit supplying the clock signal becomes higher. Then, the clock adjustment circuit 10 supplies the clock signal obtained after the duty ratio is adjusted to a given external circuit.

Figure 15:
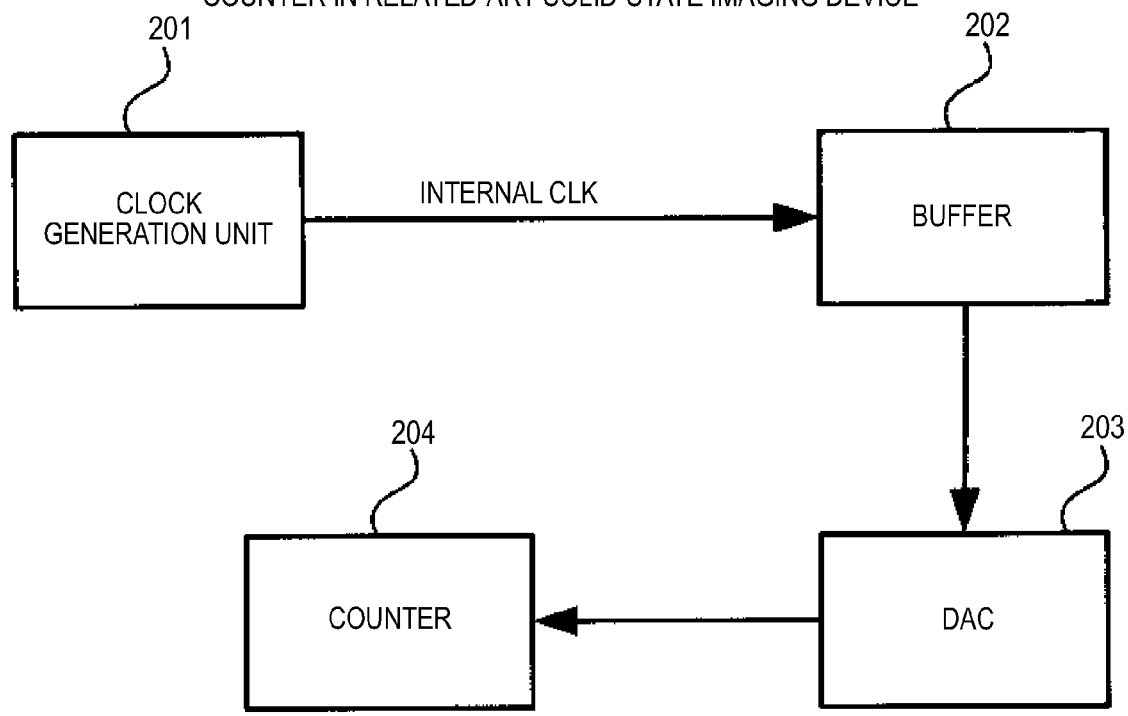
FIG. 15 is a circuit block configuration diagram on the periphery of a counter in a solid-state imaging device in related art.
Figure 16:
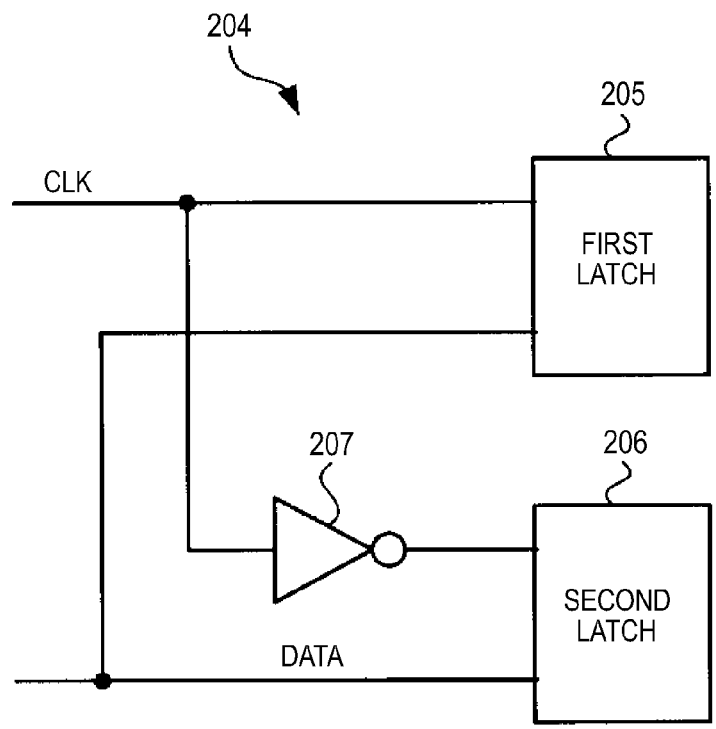
FIG. 16 is a diagram for explaining operation summary of the DDR-driven counter in related art.

In the embodiment, the clock adjustment circuit 10 which adjusts the duty ratio of the clock signal to 50% will be explained. That is, an example of the clock adjustment circuit 10 suitable to be used when the counter 204, the DAC 203 and the like, for example, in the solid-state imaging device shown in FIG. 15 are DDR driven will be explained. Note that the application of the invention is not limited to this example. The clock adjustment circuit according to the embodiment of the invention can determine whether the duty ratio of the clock signal is higher or lower than 50% as described later, therefore, the circuit can be applied to applications in which signals having duty ratios higher than 50% or lower than 50% are necessary.

The clock adjustment circuit 10 includes a duty ratio changing circuit 1 (duty ratio correction circuit), a duty ratio detection circuit 2 (shift detection circuit) and a duty ratio control circuit 3 as shown in FIG. 1.

The duty ratio changing circuit 1 whose input terminal is connected to the clock generation unit 5 corrects (changes) the duty ratio of the clock signal inputted from the clock generation unit 5 to a given value. Then, the duty ratio changing circuit 1 outputs the clock signal obtained after the duty ratio is corrected to an external circuit such as a counter as well as outputs the signal to the duty ratio detection circuit 2. The detailed configuration of the duty ratio changing circuit 1 will be described later.

The duty ratio detection circuit 2 whose input terminal is connected to an output terminal of the duty ratio changing circuit 1 detects the duty ratio of the clock signal outputted from the duty ratio changing circuit 1. In the embodiment, the duty ratio detection circuit 2 detects whether the duty ratio of the clock signal is 50%, higher than 50% or lower than 50%. Then, the duty ratio detection circuit 2 outputs a detected result of the duty ratio of the clock signal (a signal for adjusting the duty ratio) to the duty ratio control circuit 3. That is, the duty ratio detection circuit 2 detects the duty ratio of the clock signal actually supplied to the external circuit such as the counter in real time. The detailed configuration of the duty ratio detection circuit 2 will be explained later.

The duty ratio control circuit 3 whose input terminal is connected to an output terminal of the duty ratio detection circuit 2 controls operation of the duty ratio changing circuit 1 based on the detected result of the duty ratio inputted from the duty ratio detection circuit 2.

As described above, the clock adjustment circuit 10 according to the embodiment detects the duty ratio of the clock signal in real time while supplying the clock signal to the external circuit and feeds back the detected result to thereby adjust the duty ratio to the optimum value.

2. A Configuration and Operation of a Duty Ratio Changing Circuit

[Configuration of the Duty Ratio Changing Circuit]

Figure 2:
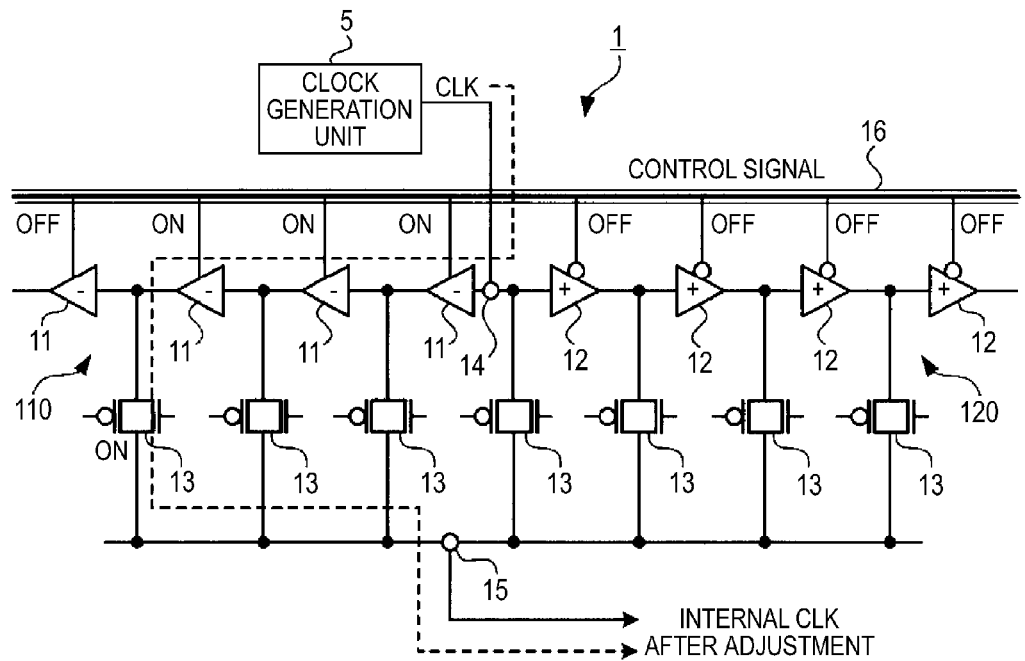
FIG. 2 shows an internal configuration of a duty ratio changing circuit.

FIG. 2 shows an internal configuration of the duty ratio changing circuit 1 according to the embodiment. The duty ratio changing circuit 1 includes plural first delay elements 11, plural second delay elements 12 and plural switches 13 (fifth switching elements).

The plural first delay element 11 are arranged in series, in which an input terminal of one first delay element 11 is connected to an output terminal of the other first delay element 11 in adjacent first delay elements 11. An input terminal of a first delay chain 110 (first delay element group) including plural first delay elements 11 which are connected in series is connected to an input terminal 14 (clock input terminal) of the duty ratio changing circuit 1.

On the other hand, the plural second delay elements 12 are also arranged in series, in which an input terminal of one second delay element 12 is connected to an output terminal of the other second delay element 12 in adjacent second delay elements 12. An input terminal of a second delay chain 120 (second delay element group) including plural second delay elements 12 which are connected in series is connected to the input terminal 14 of the duty ratio changing circuit 1.

An input terminal of one switch 13 is connected between adjacent first delay elements 11, between adjacent second delay elements as well as to the input terminal 14 of the duty ratio changing circuit 1, respectively. Output terminals of respective switches 13 are connected to an output terminal 15 (clock output terminal) of the duty ratio changing circuit 1.

Moreover, the first delay elements 11 and the second delay elements 12 have control terminals respectively and the control terminals are connected to a control line 16 connected to the duty ratio control circuit 3. According to the configuration, ON/OFF control of the first delay elements 11 and the second delay elements 12 are performed by an output signal of the duty ratio control circuit 3. Additionally, ON/OFF control of respective switches 13 is also performed by the control signal outputted from the duty ratio control circuit 3 though not shown in FIG. 2. The switching control of delay elements connected between the input terminal 14 and the output terminal 15 in the duty ratio changing circuit 1 is performed by performing ON/OFF control of respective delay elements and the switches 13.

In the embodiment, respective delay elements are ON/OFF controlled for reducing power consumption as described later, but the invention is not limited to the embodiment. It is also preferable that the first delay elements 11 and the second delay elements 12 are not ON/OFF controlled and all delay elements are in the operating state at the time of adjusting the duty ratio. In this case, the switching control of the delay elements connected between the input terminal 14 and the output terminal 15 in the duty ratio changing circuit 1 is performed only by the ON/OFF control of the switches 13.

The first delay elements 11 is a circuit element narrowing the H-width of the clock signal (widening the L-width) by delaying the rising timing of the clock signal for a given period of time. All respective first delay elements 11 have the same configuration. That is, in the example shown in FIG. 2, the amount of the H-width to be narrowed in all respective first delay elements 11 (adjustment amount of the duty ratio in respective first delay elements 11) is the same. Also in the example shown in FIG. 2, respective first delay elements 11 are configured to reduce the duty ratio by 1%.

On the other hand, the second delay element 12 is a circuit element widening the H-width of the clock signal (narrowing the L-width) by delaying the falling timing of the clock signal for a given period of time. The configuration of respective second delay elements 12 is all the same. That is, in the example shown in FIG. 2, the amount of the H-width to be widened in respective second delay elements 12 (adjustment amount of the duty ratio in respective second delay elements 12) is all the same. Also in the example shown in FIG. 2, respective second delay elements 12 are configured to increase the duty ratio by 1%.

Configurations of respective delay elements and respective delay chains are not limited to examples shown in FIG. 2 and can be changed appropriately in accordance with, for example, applications, necessary adjustment accuracy and so on. For example, the adjustment amount of the duty ratio in respective delay elements can be increased by more than 1% or less than 1%. Additionally, for example, respective delay elements included in the delay chain can have different configurations (different duty-ratio adjustment amounts) to one another. Furthermore, the number of delay elements included in each delay chain can be set appropriately in consideration of, for example, applications, assumed shift amounts of the duty ratio and so on.

[A Configuration and Operation of the Delay Element]

Figure 3:
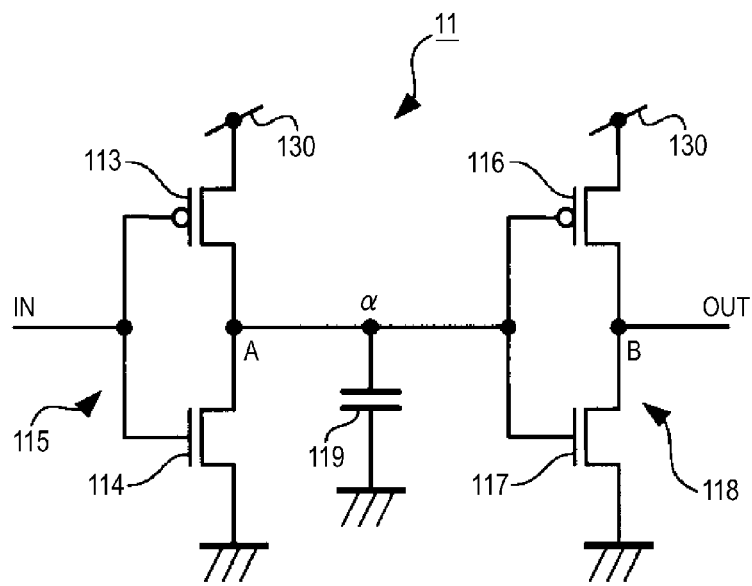
FIG. 3 is a diagram showing an internal configuration of a first delay element.

Here, an example of a configuration and operation of the delay element capable of changing the H-width of the clock signal as described above will be explained with reference to FIG. 3. FIG. 3 is a detailed circuit configuration diagram of the first delay element 11. Here, a type of the delay element which is not ON/OFF controlled by the duty ratio control circuit 3 will be explained for convenience of explanation.

In this case, the first delay element 11 includes a first inverter 115 having a PMOS (Positive channel Metal Oxide Semiconductor) transistor 113 and an NMOS (Negative channel Metal Oxide Semiconductor) transistor 114. The first delay element 11 also includes a second inverter 118 having a PMOS transistor 116 and an NMOS transistor 117, which is arranged on the output side of the first inverter 115. An input terminal of the second inverter 118 is connected to an output terminal A of the first inverter 115. The first delay element 11 further includes a capacitor element 119 connected between the output terminal A of the first inverter 115 and the ground.

Figure 4:
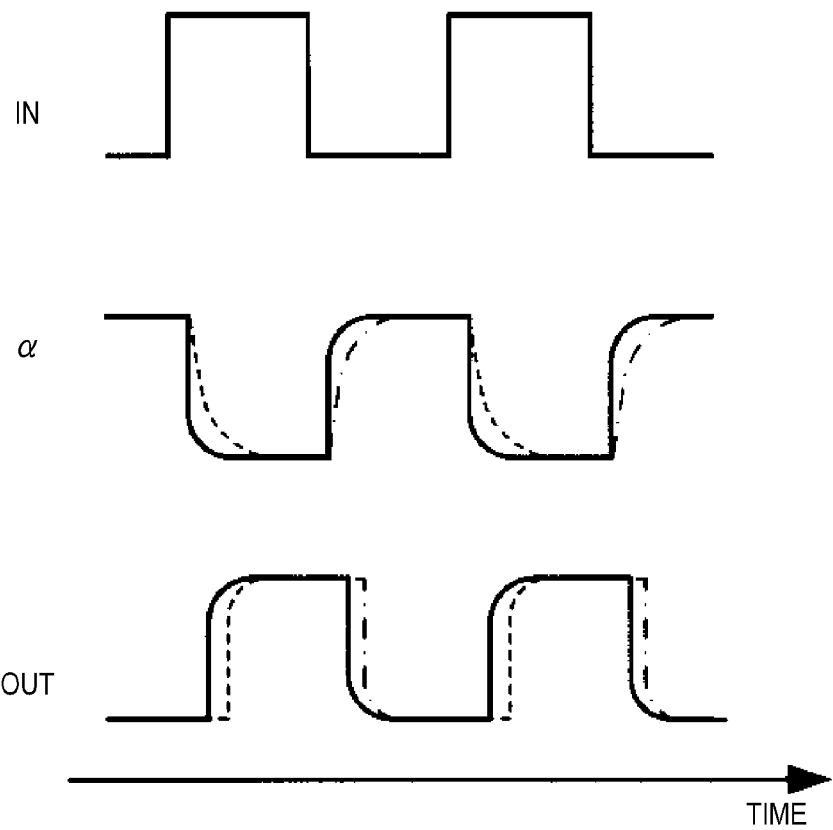
FIG. 4 is a diagram for explaining operation of the duty ratio changing circuit.

An operation example of the first delay element 11 shown in FIG. 3 is shown in FIG. 4. FIG. 4 is a signal waveform chart in the input terminal (IN) of the first delay element 11, a junction point ($\alpha$) between the capacitor element 119 and the first inverter 115 and an output terminal B (OUT) of the first delay element 11 shown in FIG. 3. The horizontal axis of the signal waveforms shown in FIG. 4 indicates time.

Assume that performance of four MOS transistors (switching elements) included in the first delay element 11 is the same. "The performance of respective switching elements is the same" in this case means that the current amount in a conductive state of respective switching elements is the same. When respective switching elements are formed by, for example, MOS transistors as in the embodiment, the performance can be the same by allowing channel sizes (a channel width and a channel length) of respective MOS transistors to be the same. "The performance of respective switching elements is the same" in this case includes not only a case in which the performance is completely the same but also a case in which the performance varies to some degree due to variations in manufacture of respective switching elements and the like (case in which the performance is approximately the same).

In this case, the signal waveform at the junction point ($\alpha$) of the capacitor element 119 is a waveform obtained by inverting the signal waveform (IN) of the input terminal of the first delay element 11 as shown by the waveform shown by a solid line of FIG. 4. The signal waveform (OUT) at the output terminal B of the first delay element 11 is a waveform obtained by inverting the signal waveform at the junction ($\alpha$) of the capacitor element 119. That is, when performance of four MOS transistors included in the first delay element 11 is the same, the first delay element 11 outputs the clock signal without changing the duty ratio of the inputted clock signal.

While in the embodiment, for example, the performance of the NMOS transistor 114 in the first inverter 115 in the four MOS transistors included in the first delay element 11 is allowed to be lower than the performance of other MOS transistors. Specifically, the channel length of the NMOS transistor 114 is allowed to be longer than other MOS transistors. It is also preferable to reduce the performance by narrowing the channel width.

According to the above configuration, a performance of taking a potential of the junction point (a) of the capacitor element 119 into the ground through the NMOS transistor 114 to be in the ON state when the clock signal changes from the L-period to the H-period is reduced. As a result, a gradient of the signal transition from the high-level to the low-level is reduced in the signal waveform at the junction point $\alpha$ in FIG. 4 as shown by a broken line. That is, the signal transition from the high-level to the low-level delays. Accordingly, the rising of the signal (OUT) outputted from the second inverter 118 delays by the amount corresponding to the above delay amount as shown by a broken line in FIG. 4. As a result, the H-width of the clock signal outputted from the first delay element 11 becomes narrower than the H-width of the inputted clock signal, and the signal with the reduced duty ratio is outputted from the first delay element 11.

The inside of the second delay element 12 can be configured by connecting two stages of inverters including the PMOS transistor and the NMOS transistor in the same manner as the circuit configuration shown in FIG. 3. However, the performance of, for example, the PMOS transistor 113 in the first inverter 115 is allowed to be lower than other MOS transistor in the example shown in FIG. 3.

According to the above configuration, a performance of pulling up the potential at the junction point (a) of the capacitor element 119 when the clock signal changes from the H-period to the L-period is reduced. As a result, a gradient of the signal transition from the low-level to the high-level is reduced in the signal waveform at the junction point a in FIG. 4 as shown by a dash-dotted line (signal transition from the low-level to the high-level delays). Accordingly, the falling of the signal (OUT) outputted from the second inverter 118 also delays by the amount corresponding to the above delay amount as shown by a dash-dotted line in FIG. 4. As a result, the H-width of the clock signal outputted from the first delay element 11 becomes wider than the H-width of the inputted clock signal, and the signal with the increased duty ratio is outputted from the first delay element 11.

Each delay element of the duty ratio changing circuit 1 according to the embodiment is realized by including two stages of the inverters (NOT elements) shown in FIG. 3, however, the delay element is a type of the delay element which is not ON/OFF controlled as described above. As all delay elements are operated at the time of operating the duty ratio changing circuit 1, power consumption is also increased when the number of delay elements is large. Accordingly, it is preferable that each delay element has a function of performing ON/OFF control of the operation in applications in which lower power consumption is requested. The configuration of the duty ratio changing circuit 1 shown in FIG. 2 shows an example of using the delay element having such function.

Figure 5:
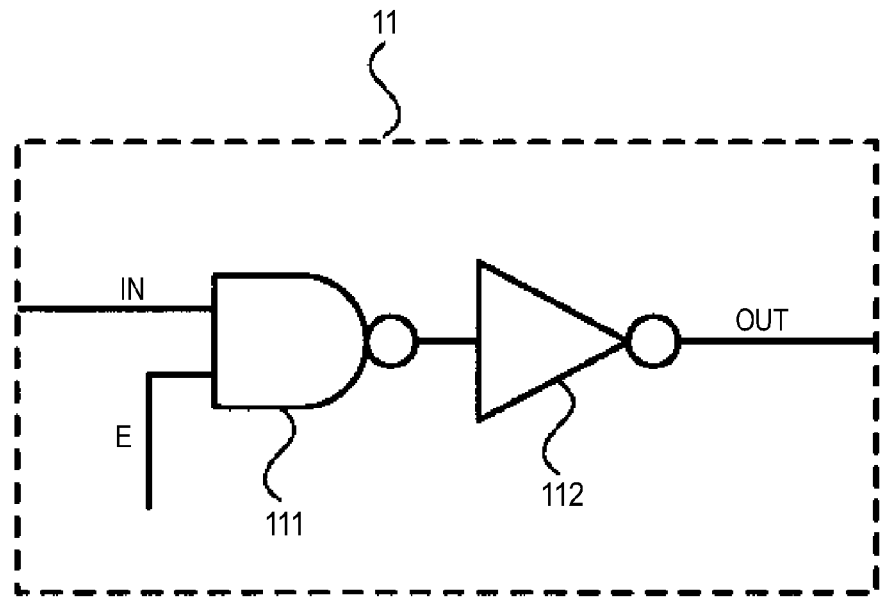
FIG. 5 is another configuration example of the first delay element.

In the embodiment, in order to give the function of ON/OFF control of the operation to the first delay element 11 in addition to the adjustment function of the H-width explained in FIG. 3, an NAND element is combined with a NOT element to configure the first delay element 11 instead of configuring the first delay element 11 by including two stages of NOT elements (inverters). A configuration example of the first delay element 11 is shown in FIG. 5.

The first delay element 11 can be configured by including a NAND element 111 and a NOT element 112 connected to an output terminal thereof. In this case, the clock signal from the clock signal generation unit 5 or the output signal from the first delay element 11 positioned at the previous stage (on the input terminal 14 side) is inputted to one input terminal of the NAND element 111. On the other hand, a control signal E is inputted from the duty ratio control circuit 3 to the other input terminal of the NAND element 111 through a control line 16. The operation of the first delay element 11 is ON/OFF controlled based on the control signal E.

Figure 6:
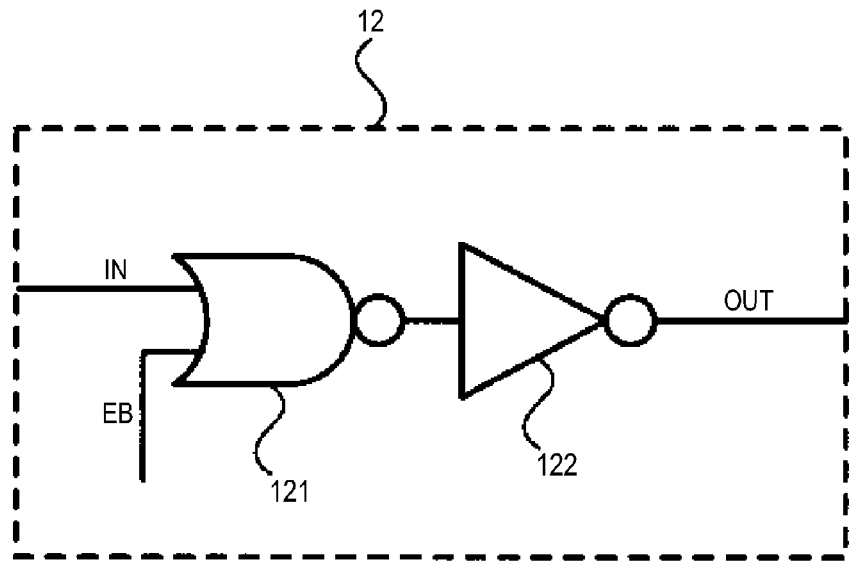
FIG. 6 is another configuration example of a second delay element.

Also in the embodiment, in order to give the function of the ON/OFF control of the operation to the second delay element 12 in addition to the adjustment function of the H-width explained in FIG. 3 in the embodiment, a NOR element is combined with the NOT element to configure the second delay element 12. FIG. 6 shows a configuration example of the second delay element 12.

The second delay element 12 can be configured by including a NOR element 121 and a NOT element 122 connected to an output terminal thereof. In this case, the clock signal from the clock signal generation unit 5 or the output signal from the second delay element 12 positioned at the previous stage (on the input terminal 14 side) is inputted to one input terminal of the NOR element 121. On the other hand, a control signal EB is inputted from the duty ratio control circuit 3 to the other input terminal of the NOR element 121 through the control line 16. The operation of the second delay element 12 is ON/OFF controlled based on the control signal EB.

In the embodiment, the duty ratio of the clock signal inputted by using the delay elements having configurations and operations shown in FIG. 3 to FIG. 6. Particularly, when respective delay elements have configurations shown in FIG. 5 and FIG. 6, only the delay elements necessary at the time of operating the duty ratio changing circuit 1 can be operated, therefore, power consumption can be reduced.

[Operation of the Duty Ratio Changing Circuit]

Next, the adjustment operation of the duty ratio in the duty ratio changing circuit 1 will be briefly explained with reference to FIG. 2. FIG. 2 shows an example of adjustment performed when the duty ratio of the clock signal to be inputted to the duty ratio changing circuit 1 is 53%.

In this case, three first delay elements 11 counted from the input terminal 14 side in the first delay chain 110 are finally turned on by the control of the duty ratio control circuit 3 and other delay elements are turned off. At this time, only the switch 13 connected to an output terminal of the third element counted from the input terminal 14 side in the first delay elements 11 is turned on under the control of the duty ratio control circuit 3.

Accordingly, the clock signal with duty ratio of 53% to be inputted to the duty ratio changing circuit 1 is outputted through three first delay elements 11 counted from the input terminal 14 side and the switch 13 connected to the output terminal of the third first delay element 11 as shown in a broken-line arrow of FIG. 2. At this process, the duty ratio is reduced 1% by 1% in each first delay element 11 through which the clock signal is transmitted, as a result, the clock signal with the duty ratio of 50% is outputted from the output terminal 15.

When the clock signal with the duty ratio of 53% is inputted in the example shown in FIG. 2, detection and adjustment of the duty ratio are repeated while turning on the first delay elements 11 one by one from the input terminal 14 side to thereby allow the circuit to be in the operating state shown in FIG. 2 in the embodiment. That is, the operation of adjusting the duty ratio by 1% is repeated three times, thereby allowing the circuit to be in the operating state shown in FIG. 2.

However, switching control of the delay elements 11 and the switches 13 in the duty ratio changing circuit 1 is not limited to the above example. For example, it is also preferable that the shift amount of the duty ratio is calculated based on the detected result (a value of potential difference) of the duty ratio detection circuit 2 described later, delay elements to be turned on are specified based on the calculated result and the specified delay elements are turned on at the same time. In this case, correspondence between the detected results (potential differences) of the duty ratio detection circuit 2 and the shift amounts of the duty ratio is checked in advance, and correspondence table or the like is stored as data.

3. A Configuration and Operation of a Duty Ratio Detection Circuit

[Configuration of the Duty Ratio Detection Circuit]

Figure 7:
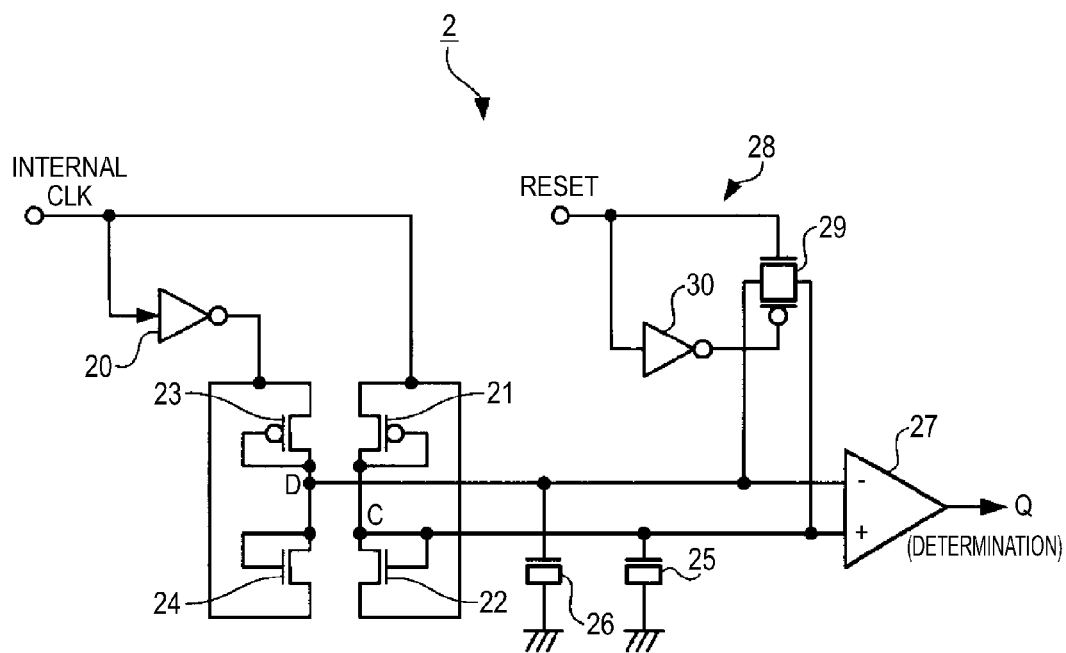
FIG. 7 is a diagram showing an internal configuration of a duty ratio detection circuit.

FIG. 7 shows an internal configuration of the duty ratio detection circuit 2 according to the embodiment.

The duty ratio detection circuit 2 includes a NOT element 20 connected to an input terminal of the internal clock. The duty ratio detection circuit 2 also includes a PMOS transistor 21 which is diode-connected (hereinafter referred to as a first MOS transistor) and an NMOS transistor 22 which is diode-connected (hereinafter referred to as a second MOS transistor). The duty ratio detection circuit 2 further includes another PMOS transistor 23 which is diode-connected (hereinafter referred to as a third MOS transistor) and another NMOS transistor 24 which is diode-connected (hereinafter referred to as a fourth MOS transistor).

In the first MOS transistor 21 and the third MOS transistor 23, a gate terminal and a drain terminal thereof are connected to thereby form the diode connection. On the other hand, in the second MOS transistor 22 and the forth MOS transistor 24, a gate terminal and a source terminal thereof are connected to thereby form the diode connection. In the embodiment, sizes such as the channel length and the channel width are all the same in the first MOS transistor 21 to the fourth MOS transistor 24 (the first to the fourth switching elements). That is, the performance is all the same in the first MOS transistor 21 to the fourth MOS transistor 24 in the embodiment.

The sizes such as the channel length and the channel width of respective MOS transistors can be different from one another as long as the current amount (performance) of respective MOS transistors in the conductive state is the same in the embodiment. The performance of the first MOS transistor 21 to the fourth transistor 24 can be different to one another to some degree due to variations in manufacture of respective MOS transistors. The performances of the first MOS transistor 21 to the fourth MOS transistor 24 can be different to one another as long as the difference is within an allowable range according to applications and so on.

The duty ratio detection circuit 2 includes a first capacitor element 25, a second capacitor element 26, a differential amplifier 27 (shift detection unit) and a reset circuit 28. The reset circuit 28 includes a reset switch 29 and a NOT element 30. The connection relation among respective elements is as follows.

A source terminal of the first MOS transistor 21 is connected to a drain terminal of the second MOS transistor 22, and the drain terminal of the first MOS transistor 21 is connected to a source terminal of the second MOS transistor 22. That is, the source terminals and the drain terminals are connected to each other between the first MOS transistor 21 and the second MOS transistor 22. In the embodiment, the source terminal of the first MOS transistor 21 (the side to which a gate terminal is not connected) is connected to an input terminal of the internal clock signal. That is, an in-phase clock signal is inputted to the circuit including the first MOS transistor 21 and the second MOS transistor 22 which are diode connected.

Also in the embodiment, the drain terminal of the first MOS transistor 21 (the source terminal of the second MOS transistor 22) is connected to an input terminal on the positive side of the differential amplifier 27. Hereinafter, a junction point between the drain terminal of the first MOS transistor 21 and the source terminal of the second MOS transistor 22 is referred to as a junction C.

A source terminal of the third MOS transistor 23 is connected to a drain terminal of the fourth MOS transistor 24, and a drain terminal of the third MOS transistor 23 is connected to a source terminal of the fourth MOS transistor 24. That is, the source terminals and the drain terminals are connected to each other between the third MOS transistor 23 and the fourth MOS transistor 24. In the embodiment, the source terminal of the third MOS transistor 23 (the side to which a gate terminal is not connected) is connected to an output terminal of the NOT element 20. That is, a reverse-phase clock signal is inputted to the circuit including the third MOS transistor 23 and the fourth MOS transistor 24 which are diode connected.

Also in the embodiment, the drain terminal of the third MOS transistor 23 (the source terminal of the fourth MOS transistor 24) is connected to an input terminal on the negative side of the differential amplifier 27. Hereinafter, a junction point between the drain terminal of the third MOS transistor 23 and the source terminal of the fourth MOS transistor 24 is referred to as a junction D.

One terminal of the first capacitor element 25 is connected to the junction C of the circuit including the first MOS transistor 21 and the second MOS transistor 22 and the other terminal is grounded. On the other hand, one terminal of the second capacitor element 26 is connected to the junction D of the circuit including the third MOS transistor 23 and the fourth MOS transistor 24 and the other terminal of grounded.

The reset switch 29 is provided between the junctions C, D, which is connected to an input terminal of a reset signal at one control terminal thereof and is connected to the input terminal of the reset signal through the NOT element 30 at the other control terminal thereof. In the embodiment, the circuit is shorted between the junctions C, D by using the reset switch 29 before detecting the shift of the duty ratio to allow the potential difference between the junctions C, D to be "0 (zero)". The ON/OFF control of the reset switch 29 is performed by the reset signal inputted from the duty ratio control circuit 3 to the control terminal.

[Operation of the Duty Ratio Detection Circuit]

Figure 8A:
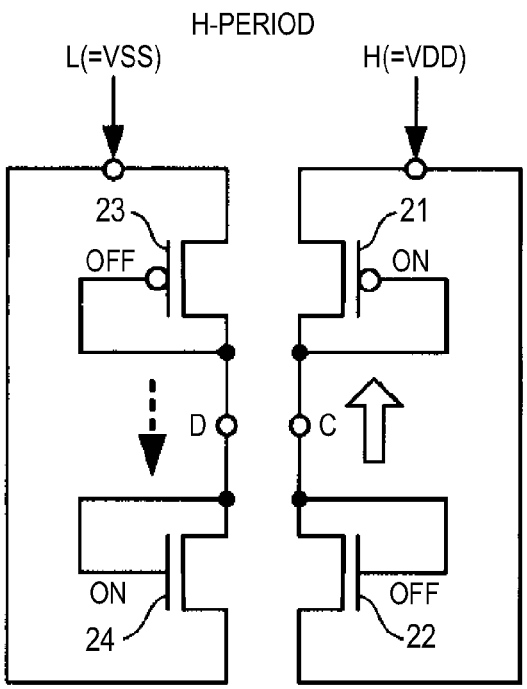
FIGS. 8A and 8B are diagrams for explaining operation of the duty ratio detection circuit.
Figure 8B:
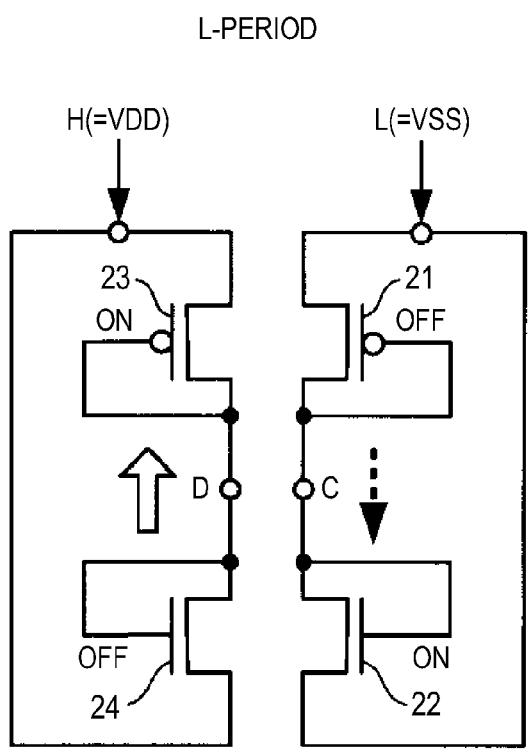

Next, operation of the duty ratio detection circuit 2 will be explained with reference to FIGS. 8A and 8B. FIG. 8A is a diagram showing an operating state of the duty radio detection circuit 2 when the clock signal to be inputted is in the H-period. FIG. 8B shows a diagram showing an operating state of the duty radio detection circuit 2 when the clock signal to be inputted is in the L-period. In examples shown in FIGS. 8A and 8B, a case where an initial state of potentials in the junctions C, D in the duty ratio detection circuit 2 is in an intermediate value between a high-level voltage VDD and a low-level voltage VSS of the clock signal will be explained for simplifying explanation.

First, when the clock signal is in the H-period, a high-level voltage VDD is supplied to the circuit including the first MOS transistor 21 and the second MOS transistor 22 as shown in FIG. 8A. In this case, the potential (VDD) at the input terminal of the circuit is relatively higher than the potential at the junction C (gate terminal), therefore, the P-channel first MOS transistor 21 is turned on and the N-channel second MOS transistor 22 is turned off. Accordingly, the potential of the junction C is increased (an outline arrow shown in FIG. 8A) and the first capacitor element 25 connected to the junction C is charged.

At this time, the low-level voltage VSS is supplied to the circuit including the third MOS transistor 23 and the fourth MOS transistor 24. In this case, the potential (VSS) at an input terminal of the circuit is relatively lower than the potential at the junction D (gate terminal), therefore, the P-channel third MOS transistor 23 is turned off and the N-channel fourth MOS transistor 24 is turned on. Accordingly, the potential of the junction D is reduced (a broken-line arrow shown in FIG. 8B) and the second capacitor element 26 connected to the junction D is discharged.

On the other hand, when the clock signal is in the L-period, the low-level voltage VSS is supplied to the circuit including the first MOS transistor 21 and the second MOS transistor 22 as shown in FIG. 8B. In this case, the potential (VSS) at the input terminal of the circuit is relatively lower than the potential at the junction C, therefore, the P-channel first MOS transistor 21 is turned off and the N-channel second MOS transistor 22 is turned on. Accordingly, the potential at the junction C is reduced (a broken-line arrow shown in FIG. 8B) and the first capacitor element 25 connected to the junction C is discharged.

At this time, the high-level voltage VDD is supplied to the circuit including the third MOS transistor 23 and the fourth MOS transistor 24. In this case, the potential (VDD) at the input terminal of the circuit is relatively higher than the potential of the junction D, therefore, the P-channel third MOS transistor 23 is turned on and the N-channel fourth MOS transistor 24 is turned off. Accordingly, the potential at the junction D is increased (an outline arrow shown in FIG. 8B) and the second capacitor element 26 connected to the junction D is charged.

Figure 9:
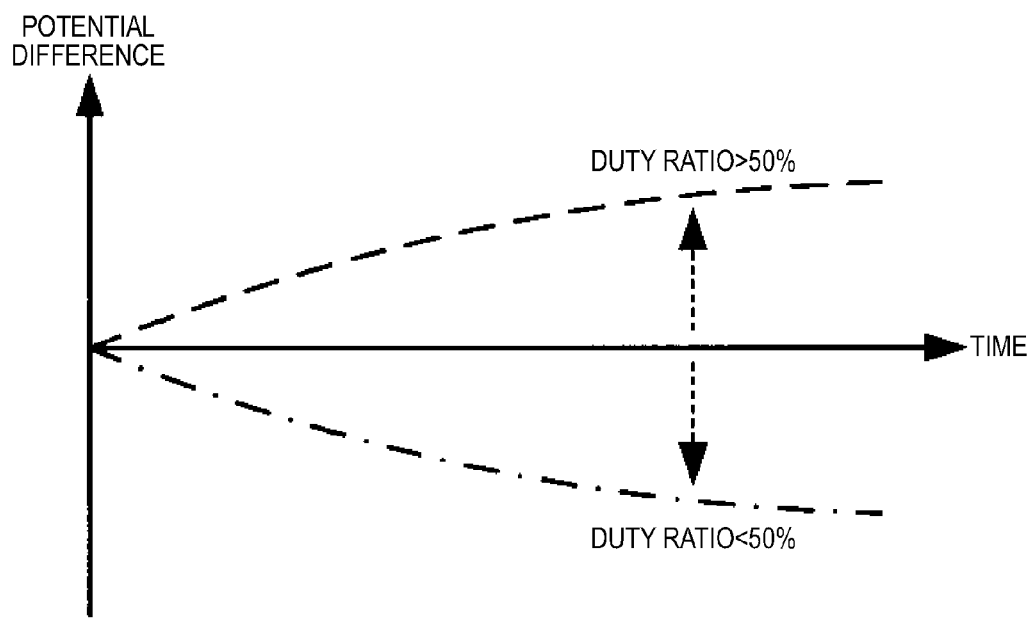
FIG. 9 is a diagram for explaining a determination principle of the duty ratio detection circuit.

As described above, the first capacitor element 25 and the second capacitor element 26 repeat charging and discharging so as to correspond to the H-period and the L-period of the clock signal in the duty ratio detection circuit 2 according to the embodiment. However, when the H-width and the L-width of the clock signal differ, charging time and discharging time in respective capacitor elements differ. Accordingly, when repeating charging and discharging in respective capacitor elements in the case where the H-width and the L-width of the clock signal differ, potential difference occurs between the junctions C, D. Then, the potential difference is increased as the number of times of repeating charging and discharging is increased and finally saturated. FIG. 9 shows a state of variation with time in the potential difference between the junctions C, D with time. In characteristics shown in FIG. 9, the horizontal axis indicates time and the vertical axis indicates output values (potential difference) of the differential amplifier 27.

When the duty ratio of the clock signal is 50% and more (H-width>L-width), charging time of the first capacitor element 25 is longer than that of the second capacitor element 26, therefore, the potential of the junction C is higher than the potential of the junction D. Accordingly, the potential difference is increased to the positive side with lapse of detection time and saturated in this case as shown by a broken line in FIG. 9. On the other hand, when the duty ratio of the clock signal is lower than 50% (H-width<L-width), charging time of the first capacitor element 25 is shorter than that of the second capacitor element 26, therefore, the potential of the junction D is higher than the potential of the junction C. Accordingly, the potential difference is increased to the negative side with lapse of detection time and saturated in this case as shown by a dash-dotted line in FIG. 9.

That is, the shift from the duty ratio of 50% of the clock signal is converted into the potential difference between the junctions C, D in the duty ratio detection circuit 2. Then, the potential difference is amplified in the differential amplifier 27 and the amplified potential difference is outputted to the duty ratio control circuit 3 as a detection signal (determination result) of the duty ratio. Accordingly, the duty ratio detection circuit 2 detects whether the duty ratio of the clock signal is higher than 50%, lower than 50%, or 50% (potential difference=0) in the embodiment.

The detection time of the duty ratio can be optionally set as long as the potential difference generated between the junctions C, D can be accurately detected during the period. For example, when the duty ratio is adjusted 1% by 1% (delay elements are switched 1 by 1) every time the duty ratio is detected as explained in the operation of the duty ratio changing circuit 1 shown in FIG. 2, it is sufficient to detect whether the duty ratio is higher or lower than 50%. Accordingly, it is possible to set the detection time of the duty ratio to be shorter in this case.

4. A Duty Ratio Adjustment Method of a Clock Signal

Figure 10:
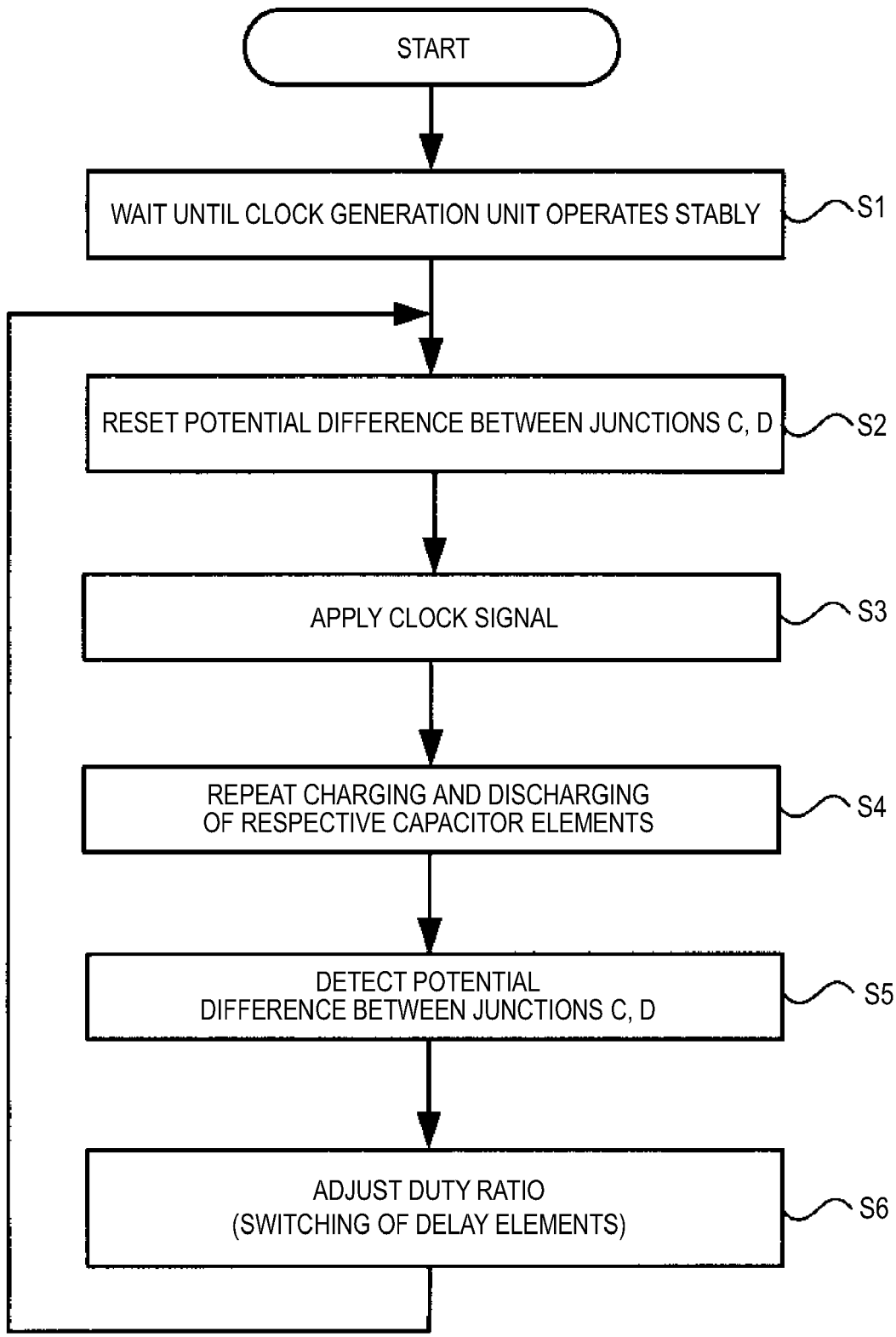
FIG. 10 is a flowchart showing a procedure of a duty-ratio adjustment method of the clock signal according to an embodiment of the invention.

Next, an example of a duty ratio adjustment method (clock adjustment method) in the clock adjustment circuit 10 according to the embodiment will be explained with reference to FIG. 10 and FIG. 11. FIG. 10 is a flowchart showing an operation procedure at the time of adjusting the duty ratio and FIG. 11 is a timing chart at the time of adjusting the duty ratio.

First, the clock adjustment circuit 10 waits until the clock generation unit 5 operates stably after applying power (Step S1). Next, the clock adjustment circuit 10 turns on the reset switch 29 in the duty ratio detection circuit 2 and allows the circuit to be shorted between the junctions C, D to reset the potential difference between the junctions C, D (Step S2). A signal waveform 41 shown at an upper part of FIG. 11 is a timing chart of the reset operation, in which the reset operation is repeated in a given cycle "t0" in the example.

After the potential difference between the junctions C, D is reset, the clock signal is inputted (applied) to the clock adjustment circuit 10 (Step S3). After that, the first capacitor element 25 and the second capacitor element 26 in the clock adjustment circuit 10 repeat charging and discharging in accordance with the operation principle of the duty ratio detection circuit 2 (Step S4). After the clock adjustment circuit 10 repeats charging and discharging of the first capacitor element 25 and the second capacitor element 26 for a given period of time, the potential difference amplified by the differential amplifier 27 is latched as a detection signal of the duty ratio in the duty ratio detection circuit 2 (Step S5).

Figure 11:
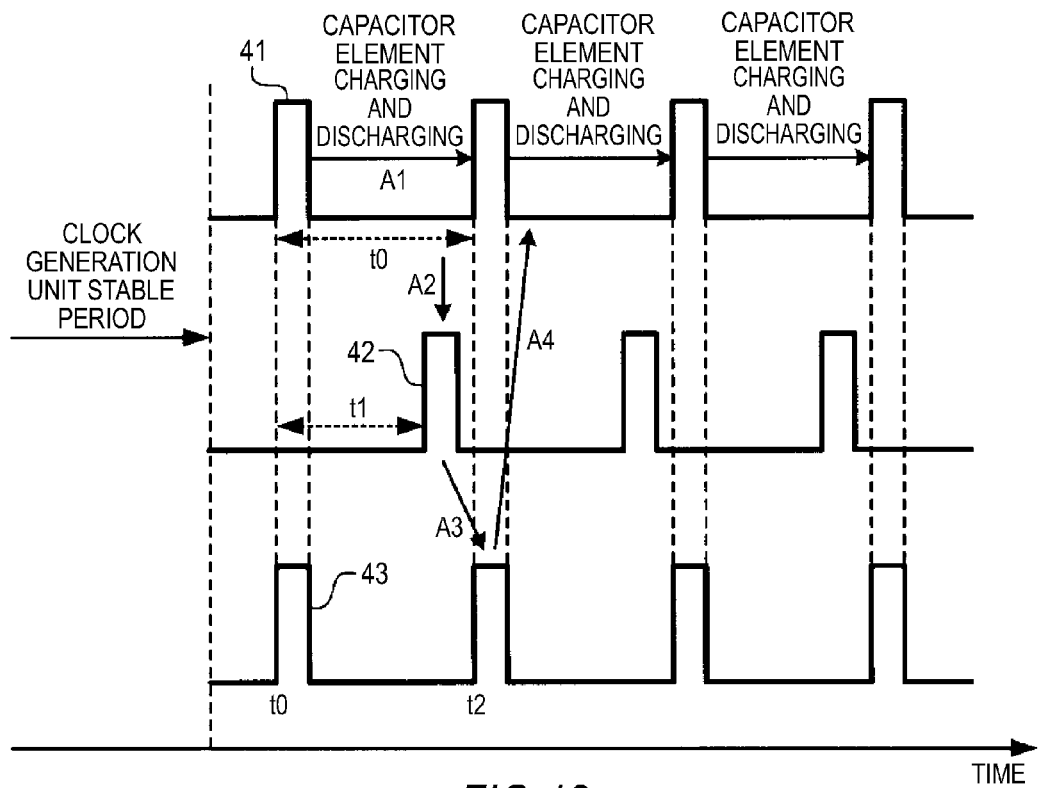
FIG. 11 is a timing chart at the timing of adjusting the duty ratio.

A signal waveform 42 shown in the middle of FIG. 11 is a timing chart of the latch operation of the detected result of the duty ratio, in which the latch operation is performed after the reset operation in a given time "t1" which is shorter than the period "t0" of the reset operation.

Next, the duty ratio control circuit 3 performs switching control of the delay elements and switches in the duty ratio changing circuit 1 based on the detected result of the latched duty ratio and adjusts the duty ratio of the clock signal so as to come close to the optimum value (Step S6). In the example, the connection state of the delay elements between input and output of the duty ratio changing circuit 1 is changed so that the duty ratio comes close to 50%.

A signal waveform 43 shown in a lower part of FIG. 11 is a timing chart of the operation of adjusting the duty ratio of the clock signal by switching the delay elements and the switches in the duty ratio changing circuit 1. In the example shown in FIG. 11, the adjustment operation is performed in synchronization with the reset operation (the signal waveform 41 in FIG. 11). That is, the switching operation of the delay elements and the switches in the duty ratio changing circuit 1 is performed during the reset operation. However, the invention is not limited to this and the adjustment operation of the duty ratio of the clock signal can be performed between the latch operation of the detected result of the duty ratio and the subsequent reset operation.

After that, the clock signal after the adjustment is outputted to an external circuit such as a counter as well as outputted to the duty ratio detection circuit 2, and operations from Step S2 to S6 are repeated in the clock adjustment circuit 10. In the embodiment, the duty ratio of the clock signal is detected in real time and is automatically adjusted based on the detected result.

In FIG. 11, the above flow of operations is shown by arrows. After the reset operation, charging and discharging of two capacitor elements in the duty ratio detection circuit 2 are repeated as shown by a solid-line arrow A1. Next, the potential difference between the junctions C, D generated by repeating charging and discharging of two capacitor elements is detected and latches after the given time of period "t1" from the reset operation as shown by a solid-line arrow A2. Then, switching of the delay elements and switches in the duty ratio changing circuit 1 is performed as shown by a solid-line arrow A3 based on the latched result to thereby adjust the duty ratio of the clock signal. Also at this time, a next reset operation is performed, and charging and discharging of the two capacitor elements in the duty ratio detection circuit 2 are repeated after switching the delay elements and switches in the duty ratio changing circuit 1 as shown by a solid-line arrow A4.

As described above, in the clock adjustment circuit 10 according to the embodiment, the duty ratio can be automatically adjusted to a desired value with high accuracy in real time without using the double-speed clock signal as in related art even when the duty ratio of the clock signal is shifted from the desired value. Therefore, it is possible to increase the frequency, the power supply voltage, a process margin and the like of the circuit particularly in applications of the circuit driven in the DDR system such as the counter in the embodiment.

The present inventors have proposed another technique for adjusting the duty ratio of the clock signal to a desired value with high accuracy before in JP-A-2010-28396. However, the invention further has the following advantages with respect to the technique.

In the technique proposed in the above Patent Document, many analog circuits using tail current are used in the duty ratio correction circuit. Therefore, analog power supply voltage for assuring analog circuit operation is necessary in the technique. As the power supply voltage in the digital system used as a power supply of the clock signal is normally lower than the analog power supply voltage, it is difficult to obtain sufficient characteristics when the digital power supply is used in the technique. On the other hand, the clock adjustment circuit 10 can be configured by using the digital circuit in the embodiment of the invention as the above, therefore, the circuit can be operated by a lower voltage digital power supply. Accordingly, it is possible to reduce power consumption in the embodiment of the invention as compared with the technique of Patent Document.

When the correction of the duty ratio is realized by using the clock signal which operates in the digital power supply voltage in the technique proposed in the Patent Document, for example, the following method can be also considered. First, the clock signal operating in the digital power supply voltage is level-shifted to a signal operating in the analog power supply voltage and the duty ratio is corrected. After that, the clock signal is shifted to the operation level of the digital power supply voltage. However, it is likely not only that the duty ratio is changed in the level-shift circuit but also that a circuit scale thereof is increased. In response to this, the clock adjustment circuit 10 can be configured by using the digital circuit as described above, therefore, it is not necessary to use the above level-shift circuit and the circuit can be downsized.

5. Various Modification Examples

Next, various modification examples of the clock adjustment circuit according to the embodiment will be explained.

Modification Example 1

In the above embodiment, the example in which MOS transistors which are diode connected are used as switching elements controlling charging and discharging of two capacitor elements in the duty ration detection circuit 2 (FIG. 7) has been explained, however, the invention is not limited to the embodiment. Optional switching elements can be used with respect to in-phase and reverse-phase clock signals to be inputted as long as switching elements operate in the same manner as the first MOS transistor 21 to the fourth MOS transistor 24 which are diode-connected. For example, diodes can be used instead of the MOS transistors which are diode-connected. An example of the above will be explained in a modification example 1.

Figure 12:
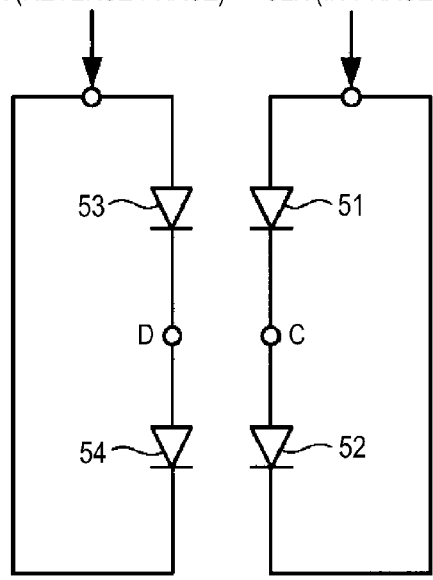
FIG. 12 is a schematic configuration diagram of a duty ratio detection circuit in a clock adjustment circuit according to a modification example 1.

FIG. 12 shows a schematic configuration of a duty ratio detection circuit in the modification example 1. Only a circuit configuration in the vicinity of junctions C, D is shown in FIG. 12. The configuration of the duty ratio detection circuit in the example is the same as the duty ratio detection circuit (FIG. 7) of the above embodiment except that the diodes are used instead of the MOS transistors which are diode connected.

The duty ratio detection circuit in the example has a configuration in which the first MOS transistors 21 to the fourth MOS transistors 24 in the duty ratio detection circuit 2 shown in FIG. 7 are replaced with a first diode 51 to a fourth diode 54.

An input terminal of the first diode 51 is connected to an input terminal of the in-phase clock signal and an output terminal thereof is connected to the junction C and an input terminal of the second diode 52. On the other hand, an output terminal of the second diode 52 is connected to the input terminal of the first diode 51. An input terminal of the third diode 53 is connected to an input terminal of a reverse-phase clock signal and an output terminal thereof is connected to the junction D and an input terminal of the fourth diode 54. An output terminal of the fourth diode 54 is connected to the input terminal of the third diode 53.

The duty ratio detection circuit in the example also operates in the same manner as that of the above embodiment. Specifically, potentials at the input terminal of the first diode 51 and at the output terminal of the second diode 52 become higher than the potential at the junction C when the clock signal is in the H-period, therefore, the first diode 51 turns on and the second diode 52 turned off. In this case, the first capacitor element 25 is charged and the potential of the junction C is increased.

In this case, potentials at the input terminal of the third diode 53 and at the output terminal of the fourth diode 54 become lower than the potential of the junction D, therefore, the third diode 53 is turned off and the fourth diode 54 is turned on. In this case, the second capacitor element 26 is discharged and the potential of the junction D is reduced.

On the other hand, potentials at the input terminal of the first diode 51 and at the output terminal of the second diode 52 become lower than the potential at the junction C when the clock signal is in the L-period, therefore, the first diode 51 turns off and the second diode 52 turned on. In this case, the first capacitor element 25 is discharged and the potential of the junction C is reduced.

In this case, potentials at the input terminal of the third diode 53 and at the output terminal of the fourth diode 54 become higher than the potential of the junction D, therefore, the third diode 53 is turned on and the fourth diode 54 is turned off. In this case, the second capacitor element 26 is charged and the potential of the junction D is increased.

As described above, the operation of the duty ratio detection circuit in the example is the same as the operation of the duty ratio detection circuit 2 according to the embodiment explained in FIGS. 8A and 8B. That is, a shift of the duty ratio can be detected and corrected in the same manner as the embodiment also in the duty ratio detection circuit of the example. Accordingly, the same advantages as the above embodiment can be obtained also in the clock adjustment circuit.

Modification Example 2

In the above embodiment, the example in which the in-phase or reverse-phase clock signal is inputted to the circuit including the PMOS transistor and the NMOS transistor which are diode-connected in the duty ratio detection circuit 2 has been explained, however, the invention is not limited to the example. It is also preferable that the duty ratio detection circuit 2 is configured by using the PMOS transistor or the NMOS transistor which are diode connected as long as the circuit can perform the same operation as the first MOS transistor 21 to the fourth MOS transistor 24. Such configuration example will be explained in a modification example 2.

(1) Modification Example 2-1

Figure 13:
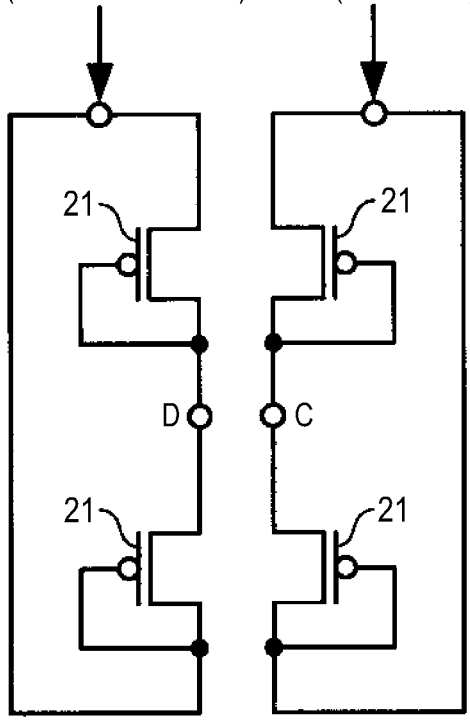
FIG. 13 is a schematic configuration diagram of a duty ratio detection circuit in a clock adjustment circuit according to a modification example 2-1.

In a modification example 2-1, an example of configuring the duty ratio detection circuit 2 by using four PMOS transistors which are diode connected will be explained. FIG. 13 shows a schematic configuration of the duty ratio detection circuit in the modification example 2-1. In FIG. 13, only a circuit configuration in the vicinity of junctions C, D is shown.

The duty ratio detection circuit in the example has a configuration in which the first MOS transistors 21 to the fourth MOS transistors 24 in the duty ratio detection circuit 2 shown in FIG. 7 are replaced with four first MOS transistors 21.

The duty ratio detection circuit in the example operates in the same manner as that of the above embodiment. Specifically, a potential at the input terminal of the clock signal becomes higher than the potential at the junction C in a circuit to which the in-phase clock signal is inputted when the clock signal is in the H-period. As a result, one (upper side in FIG. 13) first MOS transistor 21 is turned on and the other (lower side in FIG. 13) first MOS transistor 21 is turned off in the circuit to which the in-phase clock signal is inputted.

In this case, the potential at the input terminal of the clock signal becomes lower than the potential at the junction D in a circuit to which the reverse-phase clock signal is inputted. As a result, one (upper side in FIG. 13) first MOS transistor 21 is turned off and the other (lower side in FIG. 13) first MOS transistor 21 is turned on in the circuit to which the reverse-phase clock signal is inputted.

On the other hand, the potential at the input terminal of the clock signal becomes lower than the potential at the junction C in the circuit to which the in-phase clock signal is inputted when the clock signal is in the L-period. As a result, the first MOS transistor 21 at the upper side in FIG. 13 is turned off and the first MOS transistor 21 at the lower end is turned on in the circuit to which the in-phase clock signal is inputted.

In this case, the potential at the input terminal of the clock signal becomes higher than the potential at the junction D in a circuit to which the reverse-phase clock signal is inputted. As a result, the upper-side first MOS transistor 21 in FIG. 13 is turned on and the other lower-side first MOS transistor 21 is turned off in the circuit to which the reverse-phase clock signal is inputted.

As described above, the operation of the duty ratio detection circuit in the example is the same as the operation of the duty ratio detection circuit 2 of the embodiment explained in FIGS. 8A and 8B. That is, also in the duty ratio detection circuit in the example, it is possible to detect a shift of the duty ratio and to correct the shift in the same manner as the above embodiment. Accordingly, the same advantages as the above embodiment can be obtained also in the clock adjustment circuit in the example.

(2) Modification Example 2-2

Figure 14:
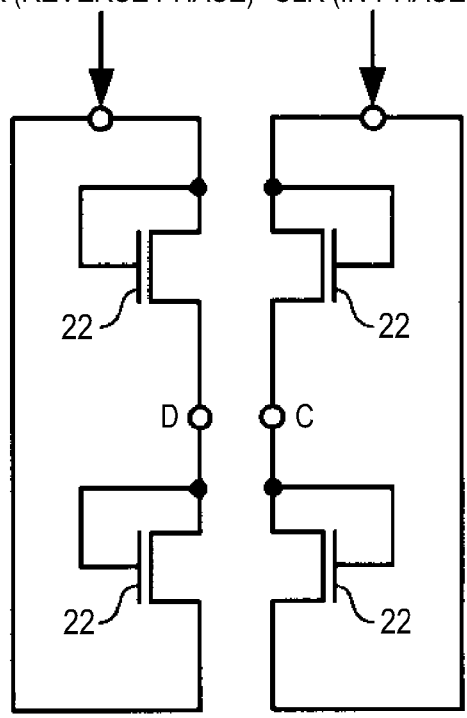
FIG. 14 is a schematic configuration diagram of a duty ratio detection circuit in a clock adjustment circuit according to a modification example 2-2.

In a modification example 2-2, an example of configuring the duty ratio detection circuit 2 by using four NMOS transistors which are diode connected will be explained. FIG. 14 shows a schematic configuration of the duty ratio detection circuit in the modification example 2-2. In FIG. 14, only a circuit configuration in the vicinity of junctions C, D is shown.

The duty ratio detection circuit in the example has a configuration in which the first MOS transistors 21 to the fourth MOS transistors 24 in the duty ratio detection circuit 2 shown in FIG. 7 are replaced with four second MOS transistors 22.

The duty ratio detection circuit in the example also operates in the same manner as the above embodiment. Specifically, a potential at the input terminal of the clock signal becomes higher than the potential at the junction C in a circuit to which the in-phase clock signal is inputted when the clock signal is in the H-period. As a result, one (upper side in FIG. 14) second MOS transistor 22 is turned on and the other (lower side in FIG. 14) second MOS transistor is turned off in the circuit to which the in-phase clock signal is inputted.

In this case, the potential at the input terminal of the clock signal becomes lower than the potential at the junction D in a circuit to which the reverse-phase clock signal is inputted. As a result, one (upper side in FIG. 14) second MOS transistor 22 is turned off and the other (lower side in FIG. 14) second MOS transistor 22 is turned on in the circuit to which the reverse-phase clock signal is inputted.

On the other hand, the potential at the input terminal of the clock signal becomes lower than the potential at the junction C in the circuit to which the in-phase clock signal is inputted when the clock signal is in the L-period. As a result, the second MOS transistor 22 at the upper side in FIG. 14 is turned off and the second MOS transistor 22 at the lower end is turned on in the circuit to which the in-phase clock signal is inputted.

In this case, the potential at the input terminal of the clock signal becomes higher than the potential at the junction D in a circuit to which the reverse-phase clock signal is inputted. As a result, the upper-side second MOS transistor 22 in FIG. 14 is turned on and the other lower-side second MOS transistor 22 is turned off in the circuit to which the reverse-phase clock signal is inputted.

As described above, the operation of the duty ratio detection circuit in the example is the same as the operation of the duty ratio detection circuit 2 of the embodiment explained in FIGS. 8A and 8B. That is, also in the duty ratio detection circuit in the example, it is possible to detect a shift of the duty ratio and to correct the shift in the same manner as the above embodiment. Accordingly, the same advantages as the above embodiment can be obtained also in the clock adjustment circuit in the example.

The present application contains subject matter related to that disclosed in Japanese Priority Patent Application JP 2010-118810 filed in the Japan Patent Office on May 24, 2010, the entire contents of which is hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. A clock adjustment circuit comprising:
a first switching element which is in a conductive state when an in-phase clock signal in a high level is applied to an input terminal;
a second switching element whose input terminal is connected to an output terminal of the first switching element, and which becomes in the conductive state when the in-phase clock signal in a low level is applied to an output terminal;
a third switching element which is in a conductive state when a reverse-phase clock signal in a high level is applied to an input terminal;
a fourth switching element whose input terminal is connected to an output terminal of the third switching element, and which becomes in the conductive state when the reverse-phase clock signal in a low level is applied to an output terminal;
a first capacitor element with one terminal connected to an output terminal of the first switching element;
a second capacitor element with one terminal connected to an output terminal of the third switching element; and
a shift detection unit that detects a potential difference between the output terminal of the first switching element and the output terminal of the third switching element and outputs the detection signal as a signal for adjusting a duty ratio of the clock signal.

2. The clock adjustment circuit according to claim 1, wherein the first switching element is a P-type MOS transistor and a gate terminal thereof is connected to a drain terminal thereof,
the second switching element is an N-type MOS transistor and a gate terminal thereof is connected to a source terminal thereof as well as the source terminal is connected to the drain terminal of the first switching element,
the third switching element is the P-type MOS transistor and a gate terminal thereof is connected to a drain terminal thereof and
the fourth switching element is the N-type MOS transistor and a gate terminal thereof is connected to a source terminal thereof as well as the source terminal is connected to the drain terminal of the third switching element.

3. The clock adjustment circuit according to claim 1, wherein the first switching element to the fourth switching element are diodes.

4. The clock adjustment circuit according to claim 1, wherein all of the first switching element to the fourth switching element have the same performance.

5. The clock adjustment circuit according to claim 1, further comprising:
a duty ratio correction circuit correcting that corrects the duty ratio of the clock signal based on the detected result of the shift detection unit.

6. The clock adjustment circuit according to claim 5, wherein the duty ratio correction circuit includes
a clock input terminal to which the clock signal is input,
a clock output terminal outputting the corrected clock signal,
a first delay element group including plural first delay elements connected in series which delay the rising timing of the clock signal for a given period of time, in which input terminals thereof are connected to the clock input terminal,
a second delay element group including plural second delay elements connected in series which delay the falling timing of the clock signal for a given period of time, in which input terminals thereof are connected to the clock input terminal, and
plural fifth switching elements respectively provided between output terminals of the first delay elements, output terminals of the second delay elements as well as between the clock input terminal and the clock output terminal.

7. The clock adjustment circuit according to claim 6, further comprising:
a duty ratio control circuit performing that performs switching control of the first delay elements or the second delay elements connected between the clock input terminal and the clock output terminal of the duty ratio correction circuit by performing ON/OFF control of the first delay elements, the second delay elements and the plural fifth switching elements based on the detected result of the shift detection unit.

8. The clock adjustment circuit according to claim 1, further comprising:
a reset circuit that resets a potential difference between the output terminal of the first switching element and the output terminal of the third switching terminal.

9. A shift detection circuit of a duty ratio comprising:
a first switching element which is in a conductive state when an in-phase clock signal in a high level is applied to an input terminal;
a second switching element whose input terminal is connected to an output terminal of the first switching element, and which becomes in the conductive state when the in-phase clock signal in a low level is applied to an output terminal;
a third switching element which is in the conductive state when a reverse-phase clock signal in a high level is applied to an input terminal;
a fourth switching element whose input terminal is connected to an output terminal of the third switching element, and which becomes in the conductive state when the reverse-phase clock signal in a low level is applied to an output terminal;
a first capacitor element with a terminal is connected to an output terminal of the first switching element;
a second capacitor element with a terminal is connected to an output terminal of the third switching element; and
a shift detection unit that detects a shift in a duty ratio based on potential difference between the output terminal of the first switching element and the output terminal of the third switching element.

10. An imaging device comprising:
a first switching element which is in a conductive state when an in-phase clock signal in a high level is applied to an input terminal;
a second switching element whose input terminal is connected to an output terminal of the first switching element, and which becomes in the conductive state when the in-phase clock signal in a low level is applied to an output terminal;
a third switching element which is in the conductive state when a reverse-phase clock signal in a high level is applied to an input terminal;
a fourth switching element whose input terminal connected to an output terminal of the third switching element, and which becomes in the conductive state when the reverse-phase clock signal in a low level is applied to an output terminal;
a first capacitor element with a terminal is connected to an output terminal of the first switching element;
a second capacitor element with a terminal is connected to an output terminal of the third switching element; and
a shift detection unit that detects potential difference between the output terminal of the first switching element and the output terminal of the third switching element and outputs the detection signal as a signal for adjusting a duty ratio of the clock signal.

11. A clock adjustment method in a clock adjustment circuit including
a first switching element which is in a conductive state when an in-phase clock signal in a high level is applied to an input terminal,
a second switching element whose input terminal is connected to an output terminal of the first switching element, and which becomes in the conductive state when the in-phase clock signal in a low level is applied to an output terminal,
a third switching element which is in the conductive state when a reverse-phase clock signal in a high level is applied to an input terminal,
a fourth switching element whose input terminal connected to an output terminal of the third switching element, and which becomes in the conductive state when the reverse-phase clock signal in a low level is applied to an output terminal,
a first capacitor element with a terminal is connected to an output terminal of the first switching element,
a second capacitor element with a terminal is connected to an output terminal of the third switching element, and
a shift detection unit that detects potential difference between the output terminal of the first switching element and the output terminal of the third switching element, the method comprising the steps of:
applying the in-phase clock signal from the outside to the input terminal of the first switching element and the output terminal of the second switching element as well as applying the reverse-phase clock signal to the input terminal of the third switching element and the output terminal of the fourth switching element;

repeating charging and discharging by the first capacitor element and the second capacitor element due to the application of the clock signal; and detecting potential difference between the output terminal of the first switching element and the output terminal of the third switching element by the shift detection unit after repeating charging and discharging of the first capacitor element and the second capacitor element for a given period of time and outputting the detection signal as a signal for adjusting the duty ratio of the clock signal.

* * * * *